(12) United States Patent
Sadamatsu

(10) Patent No.: US 10,006,783 B2
(45) Date of Patent: Jun. 26, 2018

(54) RESOLVER SIGNAL DETECTION CIRCUIT

(71) Applicant: DENSO CORPORATION, Kariya, Aichi-pref. (JP)

(72) Inventor: Hirokazu Sadamatsu, Kariya (JP)

(73) Assignee: DENSO CORPORATION, Kariya (JP)

( * ) Notice: Subject to any disclaimer, the term of this patent is extended or adjusted under 35 U.S.C. 154(b) by 121 days.

(21) Appl. No.: 15/078,004

(22) Filed: Mar. 23, 2016

(65) Prior Publication Data

US 2016/0349306 A1 Dec. 1, 2016

(30) Foreign Application Priority Data

May 28, 2015 (JP) ................................ 2015-108570

(51) Int. Cl.
| | | |
|---|---|---|
| *G01R 31/04* | (2006.01) | |
| *G01D 5/14* | (2006.01) | |
| *G01D 3/08* | (2006.01) | |
| *G01R 31/02* | (2006.01) | |
| *G01D 5/20* | (2006.01) | |
| G01R 31/00 | (2006.01) | |
| G01R 31/28 | (2006.01) | |

(52) U.S. Cl.
CPC ................. *G01D 5/14* (2013.01); *G01D 3/08* (2013.01); *G01D 5/2013* (2013.01); *G01R 31/024* (2013.01); *G01R 31/007* (2013.01); *G01R 31/2829* (2013.01)

(58) Field of Classification Search
CPC .... G01R 31/002; G01R 31/34; G01R 31/343; G01R 31/346; G01R 1/0408; G01R 31/04; G01R 31/2808; G01R 31/2818; G01R 31/06; G01R 31/027; G01R 31/041; G01D 5/14
USPC .................... 324/537, 765.01, 538, 546, 547
See application file for complete search history.

(56) References Cited

U.S. PATENT DOCUMENTS

| | | | | |
|---|---|---|---|---|
| 5,572,142 A | * | 11/1996 | Muraki ................ | G01R 31/346 324/388 |
| 9,714,845 B2 | * | 7/2017 | Asako ................... | G01D 5/2073 |
| 2007/0219733 A1 | * | 9/2007 | Kawaguchi .......... | G01D 5/2046 702/66 |

(Continued)

FOREIGN PATENT DOCUMENTS

| | | |
|---|---|---|
| JP | H05-191929 A | 7/1993 |
| JP | 2000-166205 A | 6/2000 |

(Continued)

*Primary Examiner* — Tung X Nguyen
*Assistant Examiner* — Robert P Alejnikov, Jr.
(74) *Attorney, Agent, or Firm* — Posz Law Group, PLC

(57) ABSTRACT

A power supply control part supplies offset voltages from power supplies to each of signal wires at start time and then, after a predetermined delay time period, supplies a reference voltage from a power supply. A series resistor circuit of resistor elements is provided in each signal wire and a resistor element is connected between a supply node of the offset voltage and an input terminal of the series resistor circuit. A resistor element is connected between the supply node of reference voltage and the output terminal of the series resistor circuit provided in the signal wire of a high-potential side. A comparison logic part detects a disconnection of the signal wire based on a voltage developed at the input terminal of itself during the delay time.

7 Claims, 9 Drawing Sheets

(56) References Cited

U.S. PATENT DOCUMENTS

2015/0009598 A1* 1/2015 Trombetti .............. G01R 31/08
  361/86
2015/0077156 A1* 3/2015 Kim ................... G01D 5/24457
  324/765.01

FOREIGN PATENT DOCUMENTS

| JP | 2000-354388 A | 12/2000 |
| JP | 2007-330040 A | 12/2007 |

* cited by examiner

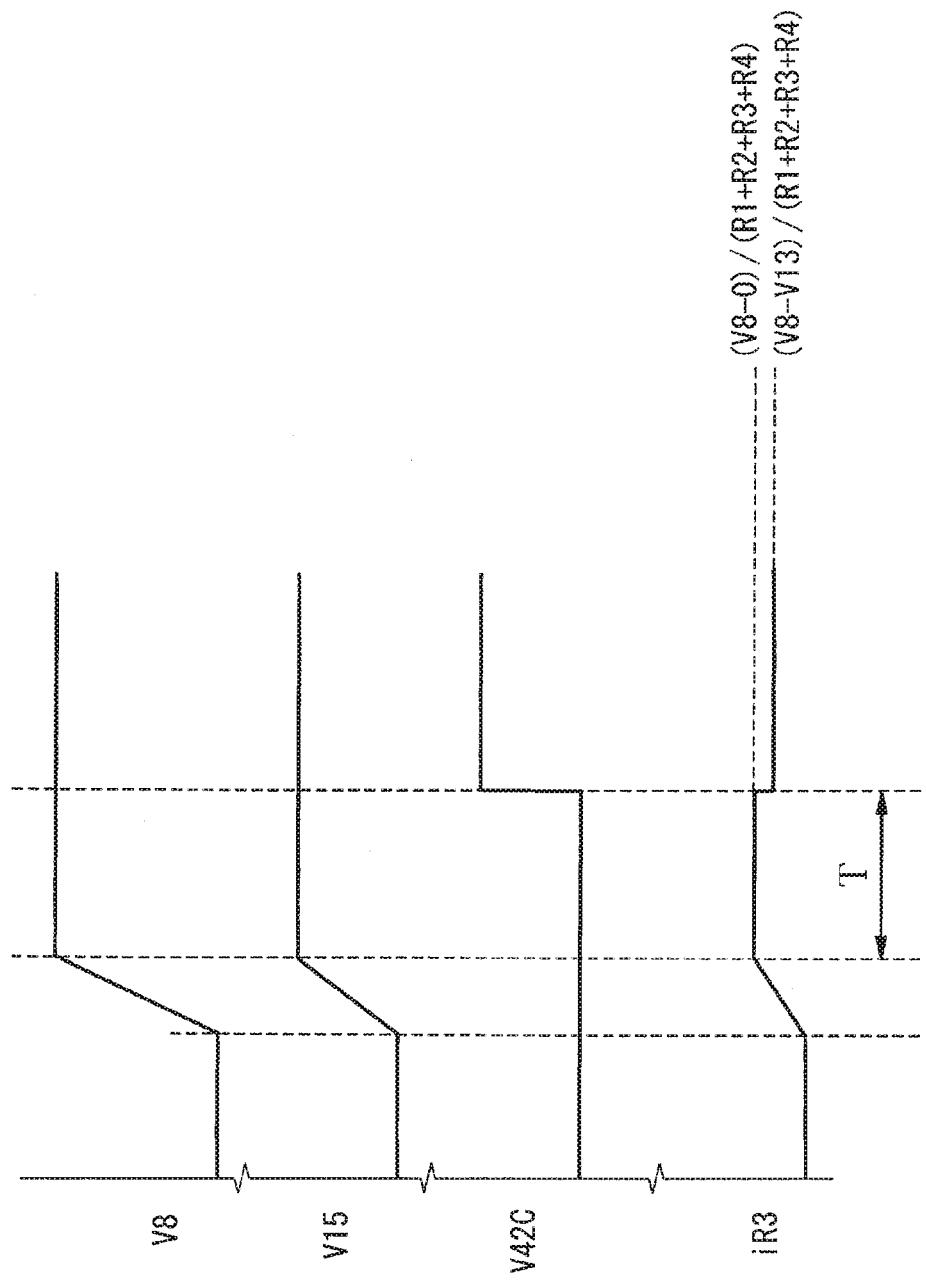

US 10,006,783 B2

RESOLVER SIGNAL DETECTION CIRCUIT

CROSS REFERENCE TO RELATED APPLICATION

This application is based on Japanese patent application No. 2015-108570 filed on May 28, 2015, the content of which is incorporated herein by reference.

TECHNICAL FIELD

The present disclosure relates to a resolver signal detection circuit, which detects a COS-phase signal and a SIN-phase signal outputted from a resolver.

BACKGROUND ART

For detecting a disconnection of signal wires connecting a resolver and an electronic circuit, which detects a COS-phase signal and a SIN-phase signal outputted from the resolver, a relation that a sum of squares of these phase signals equals 1 ($\cos^2 \theta + \sin^2 \theta = 1$) is used. That is, the disconnection is detected when the sum of squares does not equal 1. JP 2000-166205 discloses one exemplary technology of detecting inter-phase short-circuit in a resolver.

However, when a SIN-phase signal is "0" and a wire of the SIN-phase signal is disconnected under a state that a motor is not in rotation, for example, $\cos^2 \theta$ equals 1. For this reason, it is not possible to detect the disconnection unless the motor is in rotation.

SUMMARY

It is therefore an object of the present disclosure to provide a resolver signal detection circuit, which is capable of detecting a disconnection of a signal wire even under a state that a motor is not in rotation.

According to one aspect, a resolver signal detection circuit comprises first and second offset power supplies, series resistor circuits, a first resistor elements, a detection power supply, a power supply control part, a second resistor and a comparison logic part. The first and second offset power supplies supply offset voltages to a COS-phase signal and a SIN-phase signal, which are inputted from each phase of a resolver through two signal wires of a COS-phase signal wire and a SIN-phase signal wire, respectively. The series resistor circuits are provided in each signal wire and formed of plural resistor elements. The first resistor element is connected between a supply node of the offset voltage and an input terminal of the series resistor circuit. The detection power supply supplies a reference voltage to detect the COS-phase signal and the SIN-phase signal. The power supply control part controls the first and the second offset power supplies to supply the offset voltages at time of starting an operation and controls the detection power supply to supply the reference voltage after an elapse of a predetermined delay time period. The second resistor element is connected between the supply node of the reference voltage and an output terminal of the series resistor circuit provided in the signal wire of a high-potential side. The comparison logic part, input terminals of which are connected to a common connection node of the resistor elements of the series resistor circuit, compares voltages between the two signal wires. The comparison logic part detects disconnection of the signal wire based on the voltages inputted to the input terminals during the predetermined delay time period.

According to another aspect, a resolver signal detection circuit comprises a first current detection circuit, a second current detection circuit and a checker, in place of the comparison logic circuit. The first current detection circuit receives the COS-phase signal and detects a current flowing in the signal wire of the high-potential side, to which the reference voltage is supplied. The second current detection circuit receives the SIN-phase signal and detects the current flowing in the signal wire of the high-potential side, to which the reference voltage is supplied. The checker detects a disconnection in the signal wire based on signals outputted from the first current detection circuit and the second current detection circuit during the delay time period.

BRIEF DESCRIPTION OF THE DRAWINGS

FIG. 9 is a timing chart of operation of the fifth embodiment.

DETAILED DESCRIPTION OF THE EMBODIMENT

First Embodiment

Figure 1:
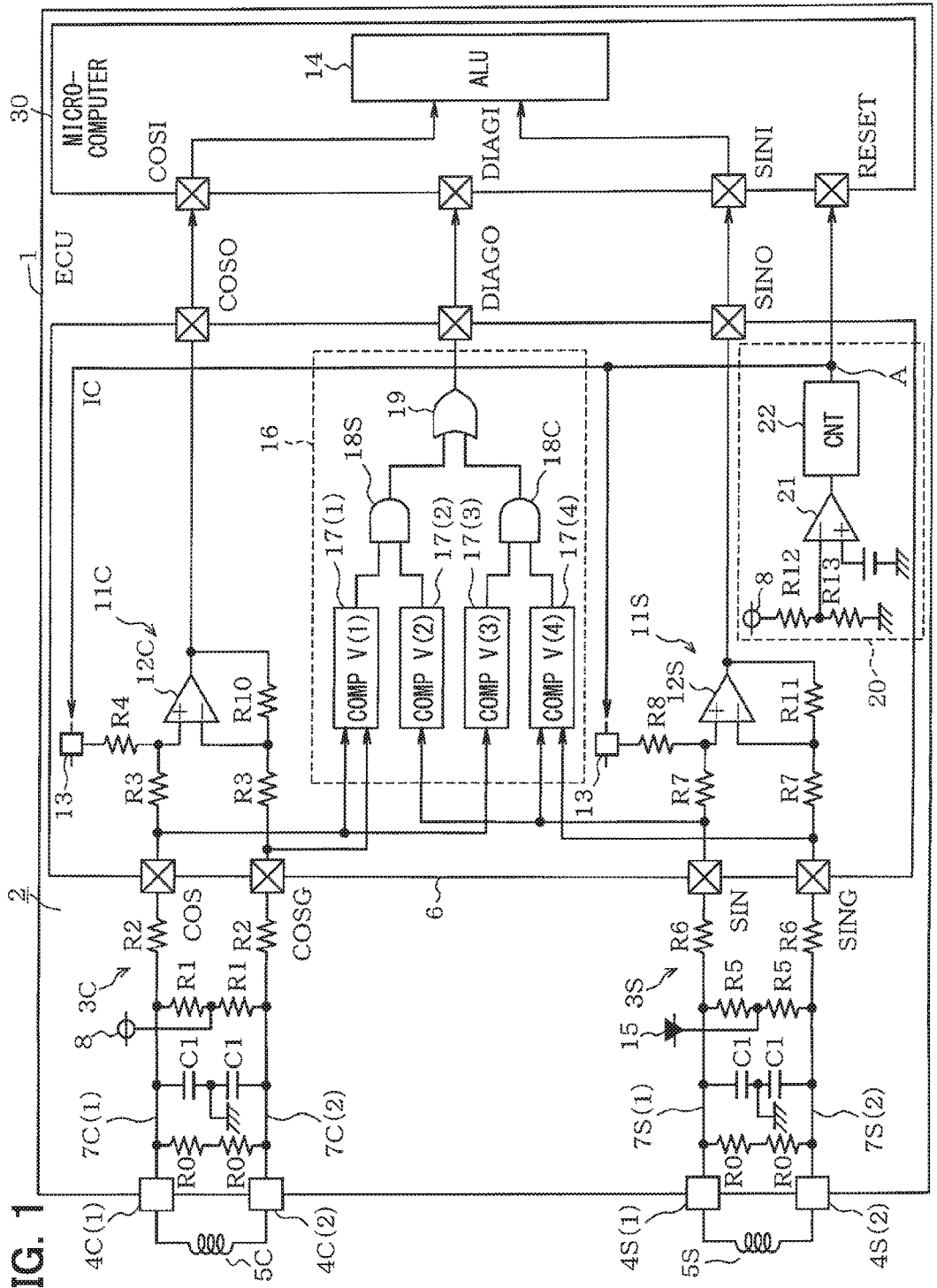
FIG. 1 is a circuit diagram showing a resolver signal detection circuit according to a first embodiment.

Referring first to FIG. 1, an electronic control unit (ECU) 1 includes a resolver signal detection circuit 2 and a microcomputer 30. The resolver signal detection circuit 2 includes a cosine-phase (COS-phase) detection part 3C and a sine-phase (SIN-phase) detection part 3S. Input terminals 4C(1) and 4C(2) of the COS-phase detection part 3C are connected to both ends of a COS-phase coil 5C of a resolver. Input terminals 4S(1) and 4S(2) of the SIN-phase detection part 3C are connected to both ends of a SIN-phase coil 5S of the resolver.

The input terminals 4C(1) and 4C(2) and input terminals COS and COSG of an integrated circuit (IC) 6, to which a part of circuit elements of the resolver signal detection circuit 2 are connected, are connected via signal wires 7C(1) and 7C(2) as well as resistor elements R2 and R2, respectively. Between the signal wires 7C(1) and 7C(2), a series circuit of two resistor elements R0, a series circuit of two capacitors C1 and a series circuit of two resistor elements R1 are connected in parallel one another. The resistor element R1 corresponds to a first resistor element. A common node of two capacitors C1 is grounded. An offset voltage V8 is supplied to a common node of two resistor elements R1 from a first offset power supply 8.

In the IC 6, a differential amplifier circuit 11C including an operational amplifier 12C is provided. A non-inverting input terminal and an inverting input terminal of the operational amplifier 12C are connected to the input terminals COS and COSG through resistor elements R3, respectively. The resistor elements R2 and R3 correspond to a series resistor circuit. The non-inverting input terminal is connected to a detection power supply 13, which supplies a voltage V13, through a resistor element R4. The inverting input terminal is connected to an output terminal of the operational amplifier 12C through a resistor element R10. The resistor element R4 corresponds to a second resistor element. The output terminal is connected to an input terminal COSI of the microcomputer 30 through an output terminal COSO of the IC 6. The microcomputer 30 has an arithmetic logic unit (ALU) 14, to which the COS-phase signal inputted to the input terminal COSI is inputted to the arithmetic logic unit 14. In the following description, terminals and signals at the terminals are occasionally referred to by same names.

The SIN-phase detection part 3C is basically configured symmetrically with the COS-phase detection part 3C and corresponding structural components are identified with suffix "S" in place of suffix "C." In the SIN-phase detection part 3C, elements corresponding to the resistor elements R1 to R4 and R10 are identified as resistor elements R5 to R8 and R11, respectively. In the SIN-phase detection part 3C, an offset voltage V15 is supplied to a common node of two resistor elements R5 from a second offset power supply 15. An output terminal of an operational amplifier 12S is connected to an input terminal SINI of the microcomputer 30 through an output terminal SINO of the IC 6. The SIN-phase signal inputted to the input terminal SINI is inputted to the arithmetic logic unit 14.

The IC 6 includes a comparison logic part 16. The comparison logic part 16 is formed of four comparators 17(1) to 17(4), two AND gates 18C, 18S and an OR gate 19. The comparators 17(1) to 17(4) correspond to first to fourth comparators, respectively. The AND gates 18C and 18S correspond to first and second AND gates, respectively.

One of input terminals of the first comparator 17(1) is connected to the input terminal COS of the IC 6 and the other of the same is connected to the input terminal COSG. That is, the first comparator 17(1) receives the COS-phase signal, which is not amplified, and compares the received COS-phase signal with a first threshold voltage V(1), which is set internally. An input terminal of the second comparator 17(2) is connected to the input terminal SIN. The second comparator 17(2) compares a potential of the input terminal SIN relative to the ground with a second threshold voltage V(2), which is set internally.

An input terminal of the third comparator 17(3) is connected to the input terminal COS. The third comparator 17(3) compares a potential of the input terminal COS relative to the ground with a third threshold voltage V(3), which is set internally. One of input terminals of the fourth comparator 17(4) is connected to the input terminal SIN and the other of the same is connected to the input terminal SING. That is, the fourth comparator 17(4) receives the SIN-phase signal, which is not amplified, and compares the received SIN-phase signal with a fourth threshold voltage V(4), which is set internally.

The first to fourth threshold voltages V(1) to V(4) of the first to fourth comparators 17(1) to 17(4) are set as follows, respectively.

V(1): maximum value (MAX voltage) of an amplitude of COS-phase signal
V(2): V15×(R7+R8)/(R6+R7+R8)
V(3): V8×(R3+R4)/(R2+R3+R4)
V(4): maximum value (MAX voltage) of an amplitude of SIN-phase signal The comparators 17(1) and 17(4) output high levels, that is, logic levels "1," when the voltages to be compared are equal to or higher than the threshold voltages V(1) and V(4), respectively. The comparators 17(1) and 17(4) output low levels, that is, logic levels "0," when the voltages to be compared are lower than the threshold voltages V(1) and V(4), respectively. The comparators 17(2) and 17(3) output logic levels "0," when the voltages to be compared are equal to or higher than the threshold voltages V(2) and V(3), respectively. The comparators 17(2) and 17(3) output logic levels "1," when the voltages to be compared are lower than the threshold voltages V(2) and V(3), respectively.

Output terminals of the comparators 17(1) and 17(2) are connected to input terminals of the AND gate 18S. Output terminals of the comparators 17(3) and 17(4) are connected to input terminals of the AND gate 18C. Output terminals of the AND gates 18S and 18C are connected to input terminals of the OR gate 19. An output terminal of the OR gate 19 is connected to an output terminal DIAGO of the IC 6. The output terminal DIAGO is connected to an input terminal DIAGI of the microcomputer 30. An output signal of the OR gate 19 is a DIAG signal. When the DIAG signal becomes the active level, that is, high level, the microcomputer 30 generates an internal interrupt and executes corresponding processing.

The IC 6 further includes a power supply control part 20, which includes a comparator 21 and a counter 22. A series circuit of resistor elements R12 and R13 is connected between the first offset power supply 8 and the ground. A common node of the resistor elements R12 and R13 is connected to an inverting input terminal of a comparator 21. A threshold voltage is supplied to a non-inverting input terminal of the comparator 21. An output terminal of the comparator 21 is connected to a trigger signal input terminal of the counter 22.

When the first offset power supply 8 is activated to start raising its power supply voltage V8 and a divided potential exceeds the threshold voltage, the comparator 21 changes its output signal from the high level to the low level. The counter 22 starts its counting operation in response to the level change as a trigger. A node A, which is an output terminal of the power supply control part 20, is set to the high level during the counting operation. When the count of the counter 22 reaches a predetermined fixed value, that is, a predetermined delay time period T elapses, the node A is changed to the low level and outputs a trigger signal for activating the power supply 13. The output signal of the power supply control part 20 is inputted to a reset terminal RESET of the microcomputer 30 as a high-active power-on reset signal.

An operation of the first embodiment will be described next. It is assumed that the resolver is attached to a traveling driving motor of an electric vehicle, which is in a stop state without a driver, for example. When a driver gets in the vehicle and turns on a power supply switch, electric power is supplied to the ECU 1.

Figure 2:
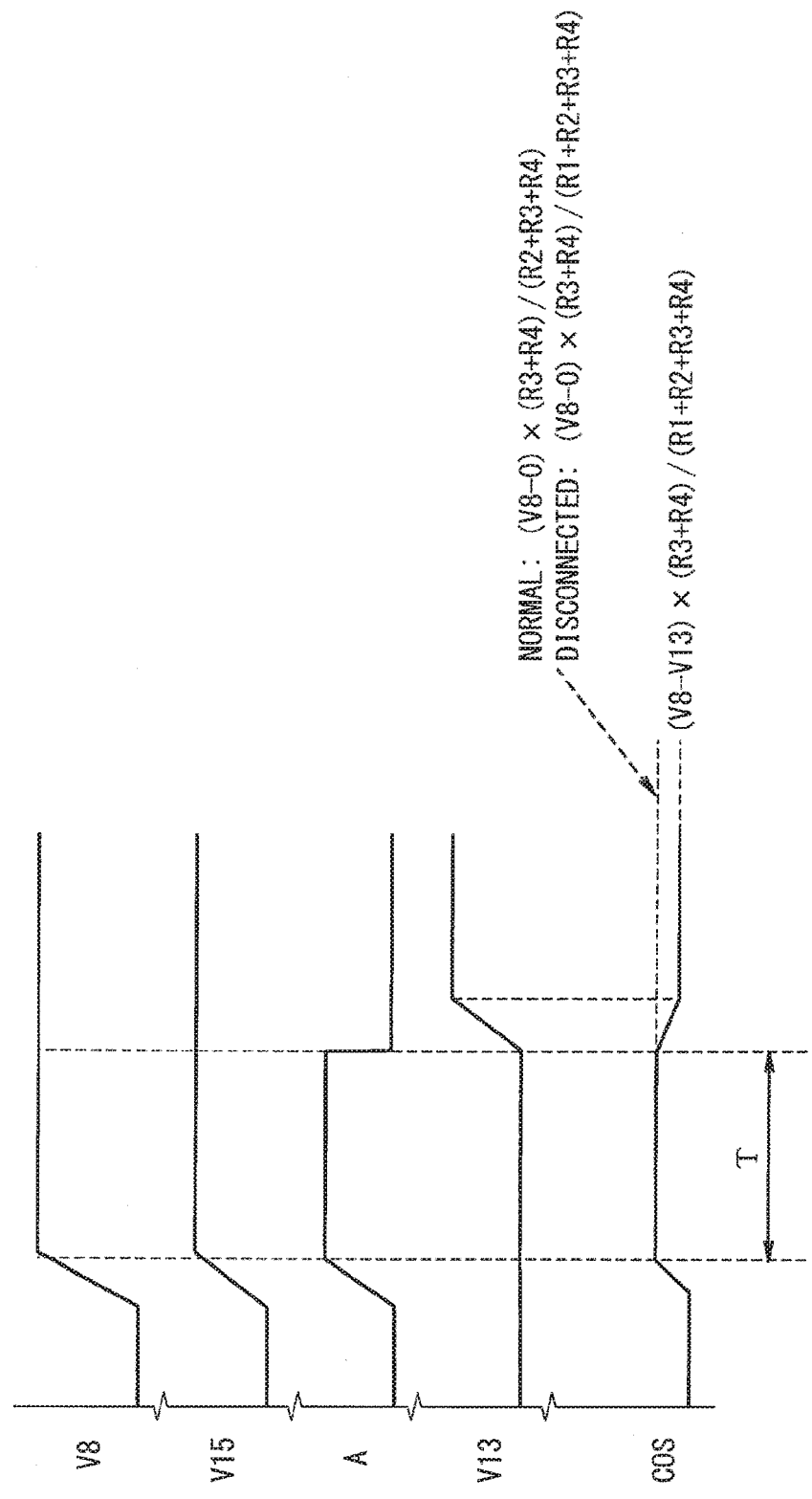
FIG. 2 is a timing chart of operation of the first embodiment.

Then, as shown in FIG. 2, the power supplies 8 and 15, which supply the signal wires 7C and 7S with the offset voltages V8 and V15, respectively, start operating generally at the same time. However, the power supply 13, which supplies the differential amplifier circuit 12 with a reference voltage V13, is not activated yet. The power supply 13 is activated to start its operation, when the counter 22 of the power supply control part 20 attains the count of the fixed value corresponding to the predetermined delay time period T and changes the node A to the low level as described above. Regarding the power supplies 8 and 13, the voltage V13 of the power supply 13 is set to be lower than the voltage V8 of the first offset power supply 8, for example.

During the predetermined delay time period T, during which the node A is at the high level and the power supply 13 does not start supplying the voltage V13, the resolver signal detection circuit 2 performs the disconnection detecting operation in the comparison logic part 16 as described below.

<Detection of Disconnection in COS-Phase Side>

FIG. 2 assumes the following signal state, that is, a special state, in which the disconnection cannot be detected conventionally with the resolver stopping its rotation. The COS-phase signal is 0 and SIN-phase signal is the MAX voltage. "COS-phase signal is 0" indicates that the voltage between the input terminals COS and COSG is zero, that the voltage of each terminal equals the voltage of the first offset power supply 8.

Since the SIN-phase signal is the MAX voltage, the comparator 17(4) outputs "1." When the signal wire 7C(1) or 7C(2) of the COS-phase side is disconnected, a current flow path is formed from the common node of the resistor elements R1 and R2, that is, the first offset power supply 8, which is the power source of the offset voltage V8, to the power supply 13, which is a reference voltage source indicating the ground potential, through the resistor elements R1 to R4.

During this predetermined delay time period T, the voltage at the input terminal COS is expressed as follows.

$$\text{COS voltage} = (V8-0) \times (R3+R4)/(R1+R2+R3+R4) \quad (1)$$

Since this voltage does not reach the threshold voltage V(3), the comparator 17(3) also outputs "1." Thus the AND gate 18C and the OR gate 19 output "1" at respective output terminals and the OR gate 19 outputs "1" at its output terminal. The output terminal DIAGO outputs the high level. This DIAG signal is inputted to the microcomputer 30.

When the signal wire 7C(1) or 7C(2) is not disconnected, the voltage at the input terminal COS becomes higher as follows and exceeds the threshold voltage V(3).

$$\text{COS voltage} = (V8-0) \times (R3+R4)/(R2+R3+R4) \quad (2)$$

Thus the comparator 17(3) outputs "0."

When the node A changes to the low level and the power supply 13 starts operating, the COS voltage changes to the voltage as expressed below. This voltage is lower than that of the equation (1).

$$\text{COS voltage} = (V8-V15) \times (R3+R4)/(R1+R2+R3+R4) \quad (3)$$

<Detection of Disconnection in SIN-Phase Side>

Next detection of disconnection in the SIN-phase side will be described assuming similarly the following signal state, in which the disconnection cannot be detected conventionally with the resolver stopping its rotation. The COS-phase signal is the MAX voltage and SIN-phase signal is 0. Since the COS-phase signal is the MAX voltage, the comparator 17(1) outputs "1." When the signal wire 7S(1) or 7S(2) of the SIN-phase side is disconnected, a current flow path is formed from the power supply 15 to the power supply 13 through the resistor elements R5 to R8. At this predetermined delay time period T, the voltage at the input terminal SIN is expressed as follows.

$$\text{SIN voltage} = (V15-0) \times (R7+R8)/(R5+R6+R7+R8) \quad (4)$$

Since this voltage does not reach the threshold voltage V(2), the comparator 17(2) also outputs "1." Thus the AND gate 18S and the OR gate 19 output "1" at respective output terminals and the OR gate 19 outputs "1" at its output terminal. The output terminal DIAGO outputs the high level. This DIAG signal is inputted to the microcomputer 30.

When the signal wire 7S(1) or 7S(2) is not disconnected, the SIN voltage is expressed as follows and exceeds the threshold voltage V(3). Thus the comparator 17(2) outputs "0."

$$\text{SIN voltage} = (V15-0) \times (R7+R8)/(R6+R7+R8) \quad (5)$$

As described above, according to the first embodiment, the power supply control part 20 supplies the offset voltages V8 and V15 from the power supplies 8 and 15 to each of the signal wires 7 at start time and then, after the predetermined delay time period T, supplies the reference voltage V13 from the power supply 13. The series resistor circuit of the resistor elements R2 and R3 or the resistor elements R6 and R7 is provided in each signal wire 7 and the resistor element R1 or R5 is connected between the supply node of the offset voltage and the input terminal of the series resistor circuit.

The resistor element R4 or R8 is connected between the supply node of the reference voltage and the output terminal of the series resistor circuit provided in the signal wire 7(1) of the high-potential side. The comparison logic part 16 detects the disconnection of the signal wire 7 based on the voltage developed at the input terminal of itself during the delay time period T. Specifically, the comparison logic part 16 is formed of the comparators 17(1) to 17(4), the AND gates 18S and 18C and the OR gate 19. It is thus possible to detect the disconnection in the signal wire 7 by the comparison logic part 16 even in a case that the resolver is not in rotation and is in the special state, which disables the disconnection detection conventionally.

Second Embodiment

A second embodiment will be described below with respect to only differences from the first embodiment while designating the same structural parts as the first embodiment with the same reference numerals for simplicity of description.

Figure 3:
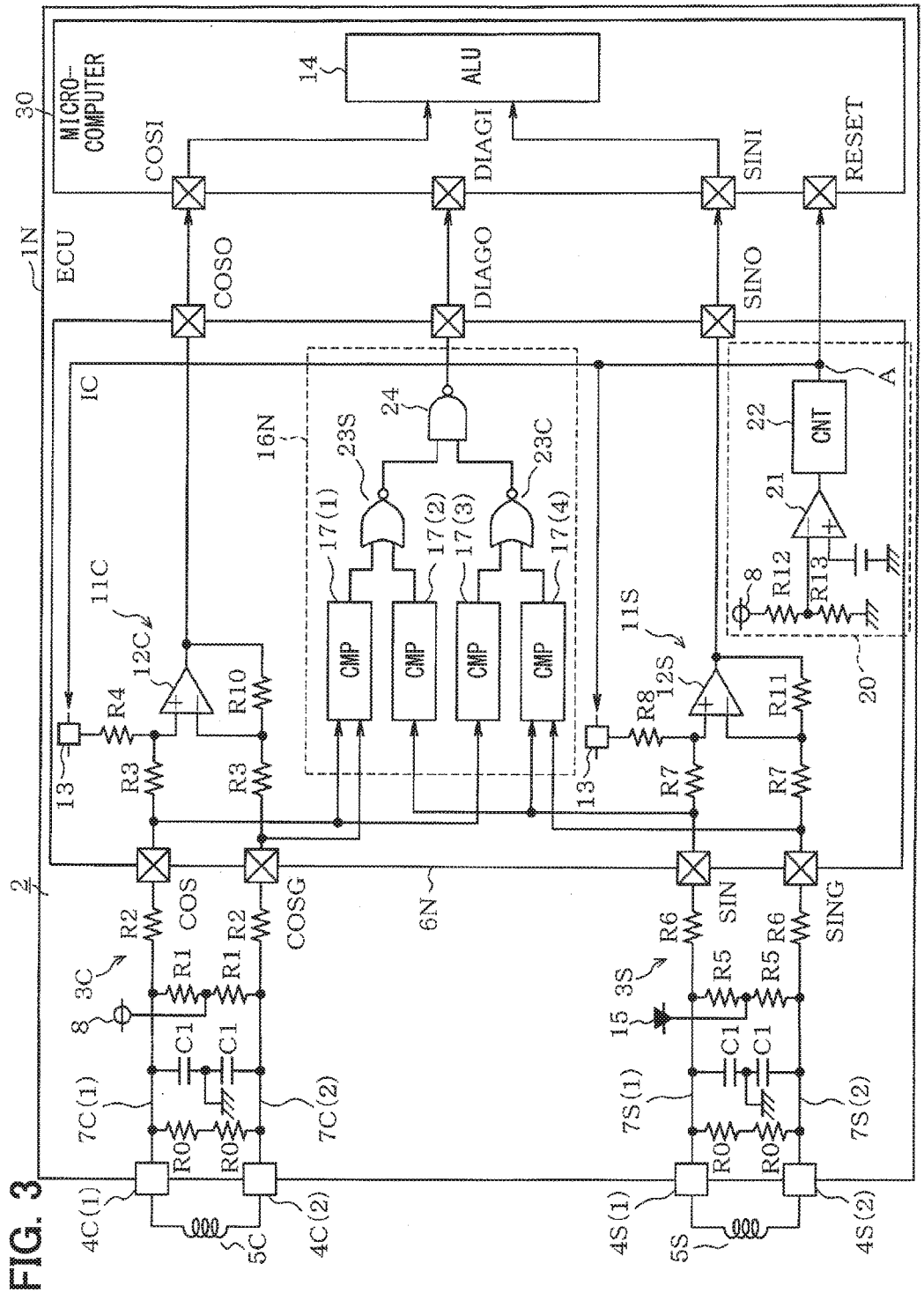
FIG. 3 is a circuit diagram showing a resolver signal detection circuit according to a second embodiment.

In the second embodiment, as shown in FIG. 3, an ECU 1N is adapted to a case, in which the DIAG signal is outputted as a low-active signal. In an IC 6N, a comparison logic part 16N is provided in place of the comparison logic part 16. The comparison logic part 16N is provided with NOR gates 23C, 23S and a NAND gate 24 in place of the AND gates 18C, 18S and the OR gate 19. Thus the DIAG signal is outputted to the microcomputer 30 as the low-active signal. The NOR gate is an AND gate operable with negative logic inputs and the NAND gate is an OR gate operable with negative logic inputs.

Third Embodiment

Figure 4:
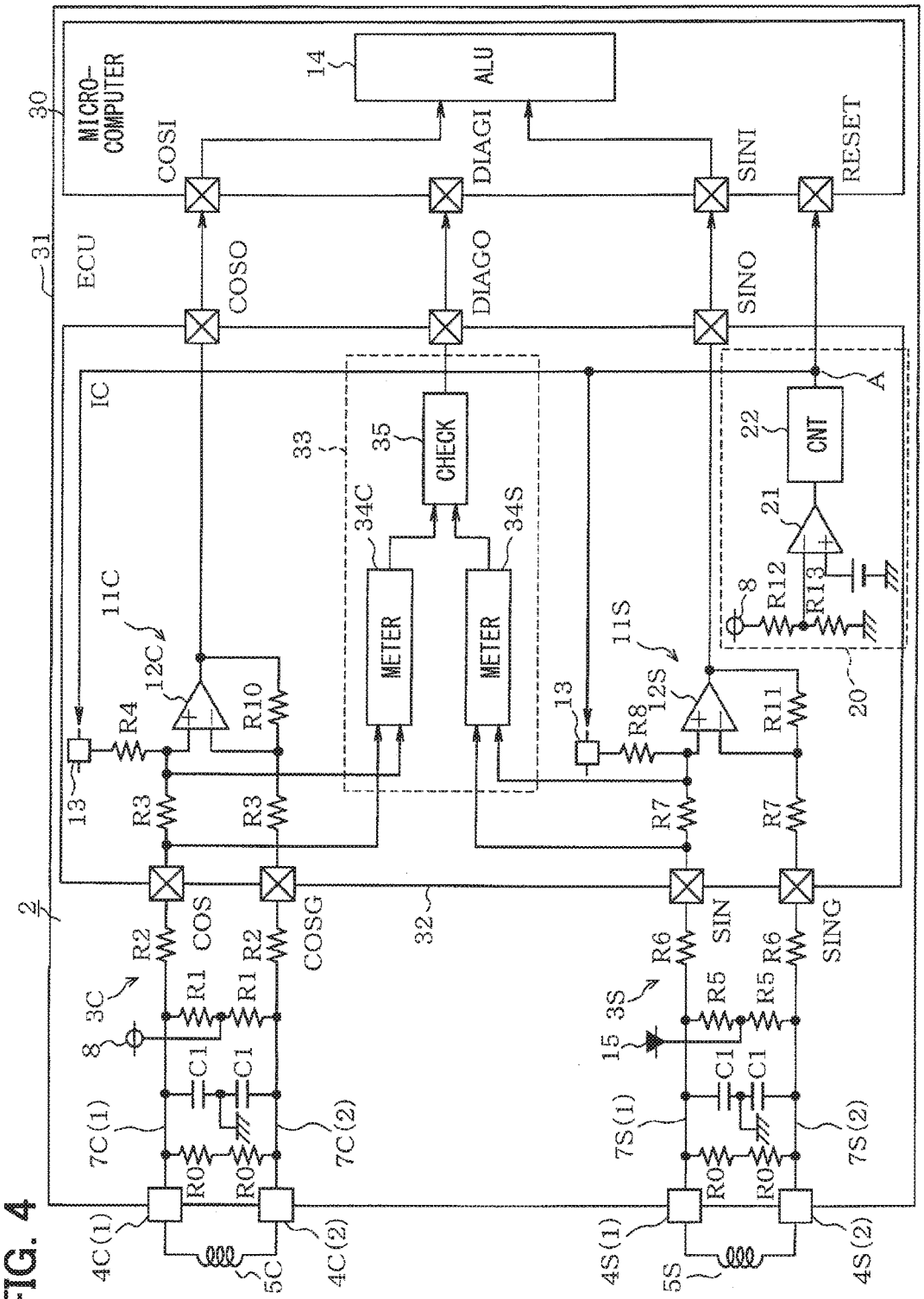
FIG. 4 is a circuit diagram showing a resolver signal detection circuit according to a third embodiment.

In a third embodiment, as shown in FIG. 4, an ECU 31 includes an IC 32, which is provided with a current check part 33 in place of the comparison logic part 16. The current check part 33 includes current meters 34C, 34S and a checker 35. The current meters 34C and 34S correspond to first and second current detection circuits, respectively. Input terminals of the current meter 34C are connected to both ends of the resistor element R3, respectively. Input terminals of the current meter 34S are connected to both ends of the resistor elements R7, respectively. The current meters 34C and 34S convert currents flowing in the resistor elements R3 and R7 into voltages, respectively, and output voltage signals to the checker 35.

In a case of the following signal input state (I) or (II), the checker outputs the DIAG signal to the microcomputer 30.
(I) Input from the current meter 34C: MAX current, and
   input from the current meter 34S: V15/(R5+R6+R7+R8)
(II) Input from the current meter 34C: (V8)/(R1+R2+R3+R4), and
   input from the current meter 34S: MAX current The MAX current is a current, which flows in the resistor element R3 or R7 under a state that the COS-phase signal or the SIN-phase signal is the MAX voltage.

An operation of the third embodiment will be described next.

<Detection of Disconnection at COS-Phase Side>

Similarly to the first embodiment, it is assumed that the resolver is not in rotation and is in the following special state. The COS-phase signal is 0 and the SIN-phase signal is the MAX voltage. Since the SIN-phase signal is the MAX voltage, the input from the current meter 34S is the MAX current. When the signal wire 7C(1) or 7C(2) of the COS-phase side is disconnected, the current flow path is formed similarly to the first embodiment. The current iR3, which flows in the resistor element R3, is expressed as follows.

$$iR3=(V8-0)/(R1+R2+R3+R4) \quad (6)$$

Figure 5:
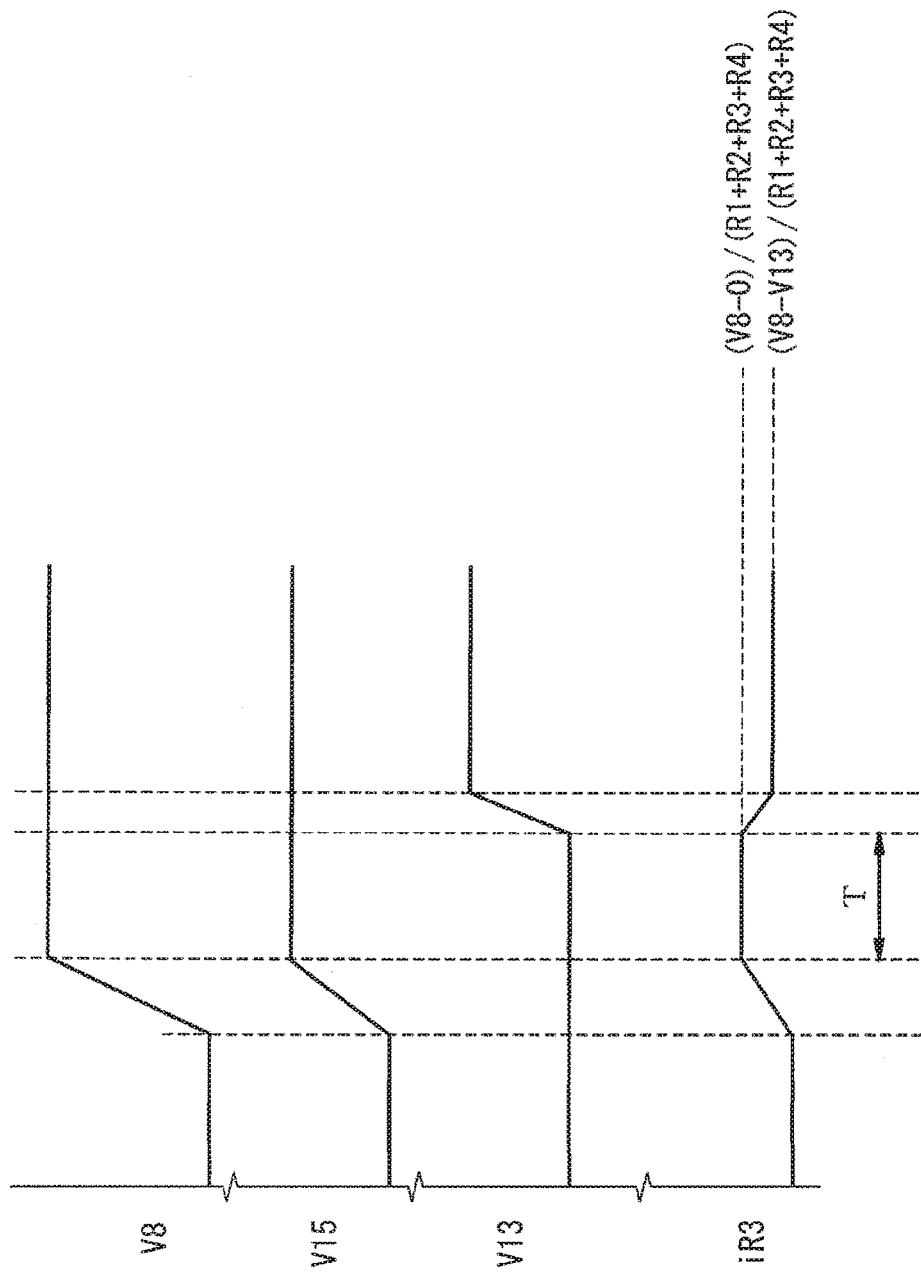
FIG. 5 is a timing chart of operation of the third embodiment.

Thus signal input state (II) holds and the checker 35 outputs the DIAG signal (refer to FIG. 5).

When the signal wire 7C(1) or 7C(2) is not disconnected, the current iR3 flowing in the resistor element R3 becomes larger as expressed as follows and the signal input state (II) does not hold.

$$iR3=(V8-0)/(R2+R3+R4) \quad (7).$$

When the node A changes to the low level and the power supply 13 starts to operate, the R3 current changes to be smaller than the current of equation (6).

$$iR3=(V8-V13)/(R1+R2+R3+R4) \quad (8)$$

<Detection of Disconnection at SIN-Phase Side>

Similarly to the first embodiment, it is assumed that the resolver is not in rotation and is in the following special state. COS-phase signal is MAX voltage, and the SIN-phase signal is 0. Since the COS-phase signal is the MAX voltage, the input from the current meter 34C is the MAX current. When the signal wire 7S(1) or 7S(2) of the SIN-phase side is disconnected, the current flow path is formed similarly to the first embodiment. The current iR7, which flows in the resistor element R7, is expressed as follows.

$$iR7=(V15-0)/(R5+R6+R7+R8) \quad (9)$$

Thus signal input state (I) holds and the checker 35 outputs the DIAG signal.

When the signal wire 7C(1) or 7C(2) is not disconnected, the current iR7 flowing in the resistor element R7 becomes larger as expressed as follows and the signal input state (I) does not hold.

$$iR7=(V15-0)/(R6+R7+R8) \quad (10).$$

In the third embodiment described above, the ECU 31 includes the IC 32, which is provided with the current check part 33, and the current check part 33 is formed of the current meters 34C, 34S and the checker 35. The checker 35 detects the disconnection when the current detected by one of the current meters 34C and 24S indicates the maximum value and the current detected by the other indicates a value, which is determined by the offset voltage and the resistance value of the current flow path from the terminal of the offset voltage supply to the terminal of the reference voltage. It is thus possible to detect the disconnection similarly to the first embodiment based on the state of currents flowing in the resistor elements R3 and R7, which vary with presence and absence of disconnection in the signal wire 7 and are detected by the current meters 34C and 34S, respectively.

Fourth Embodiment

Figure 6:
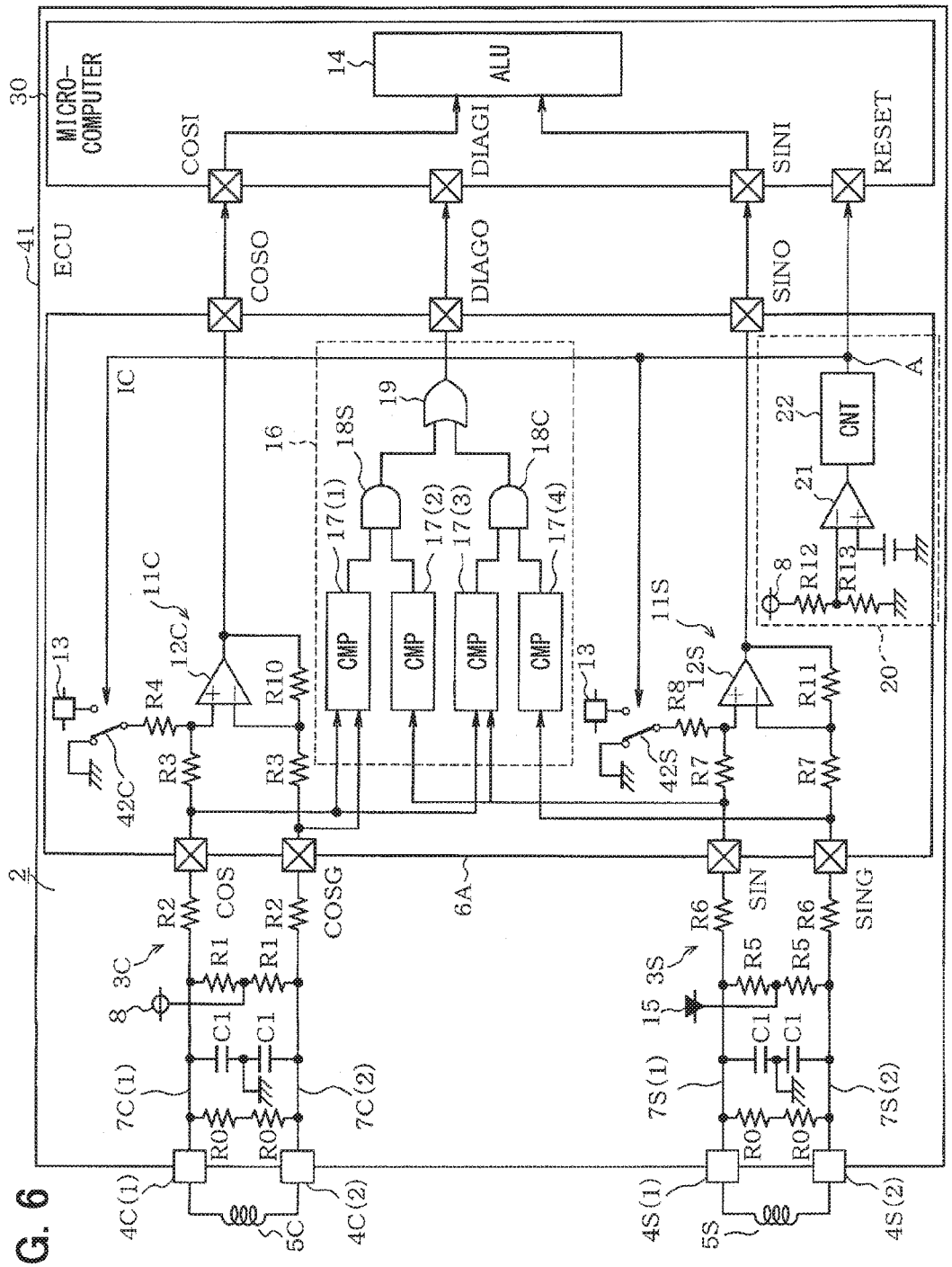
FIG. 6 is a circuit diagram showing a resolver signal detection circuit according to a fourth embodiment.

In a fourth embodiment, as shown in FIG. 6, an ECU 41 is provided with changeover switches 42C and 42S between the power supplies 13 and the resistor elements R4 and R8, respectively. The changeover switches 42C and 42S change over one ends of the resistor elements R4 and R8 to either one of the power supply 13 and the ground. This changeover operation is controlled by the power supply control part 20. The changeover switches 42C and 42S correspond the voltage supply control part. The changeover switches 42C and 42S connect one ends of the resistors R4 and R8 to the ground side and the power supply 13 side when the control voltage supplied from the power supply control part 20 is at the low level and the high level, for example, respectively.

Figure 7:
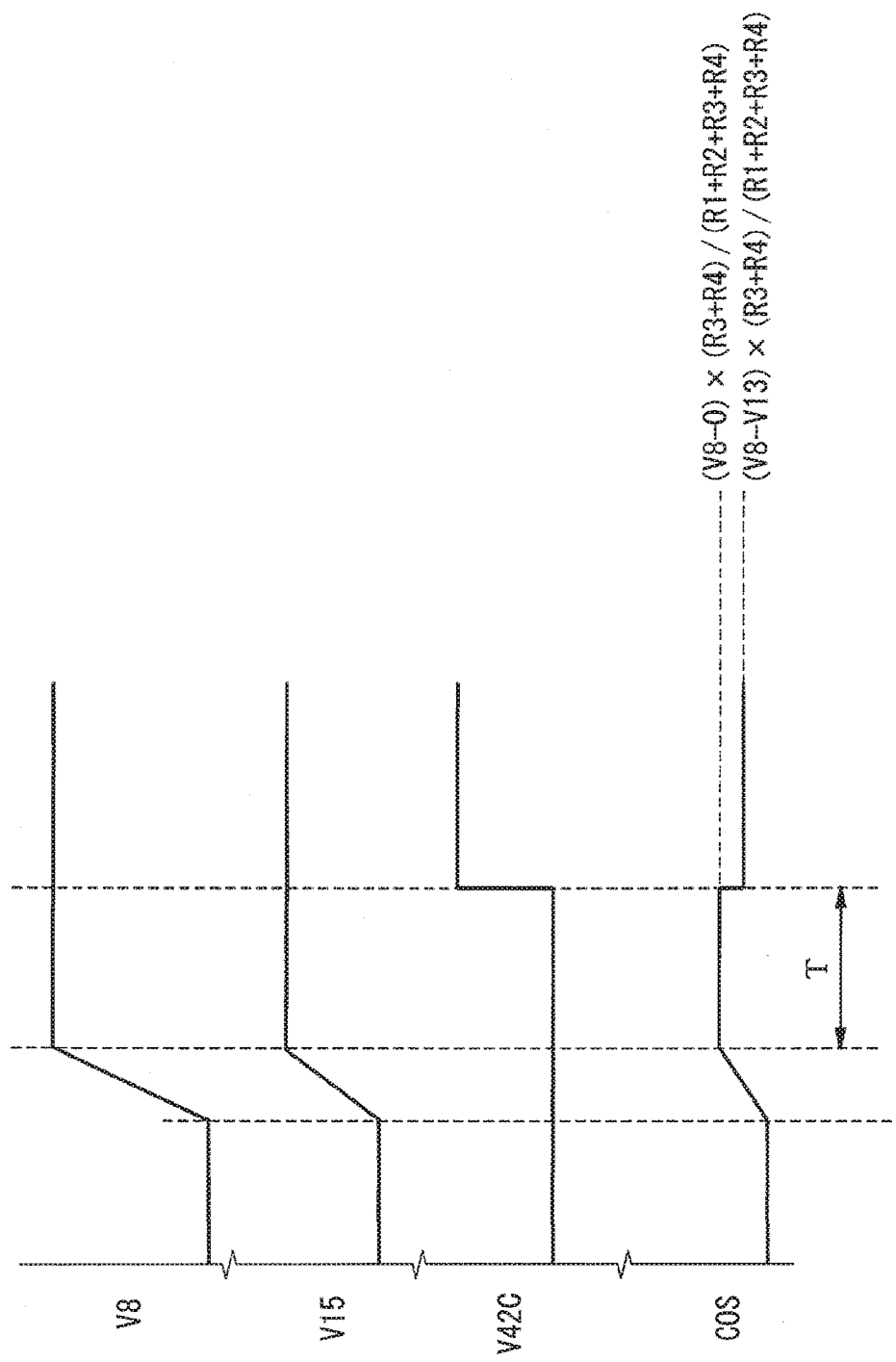
FIG. 7 is a timing chart of operation of the fourth embodiment.

An operation of the fourth embodiment will be described below. As shown in FIG. 7, one end of the resistor element R4 is connected to the ground by the changeover switch 42C in the predetermined delay time period T and this end is switched over to be connected to the power supply 13 after the predetermined delay time period T. Thus the same advantage is provided as in the first embodiment.

Fifth Embodiment

Figure 8:
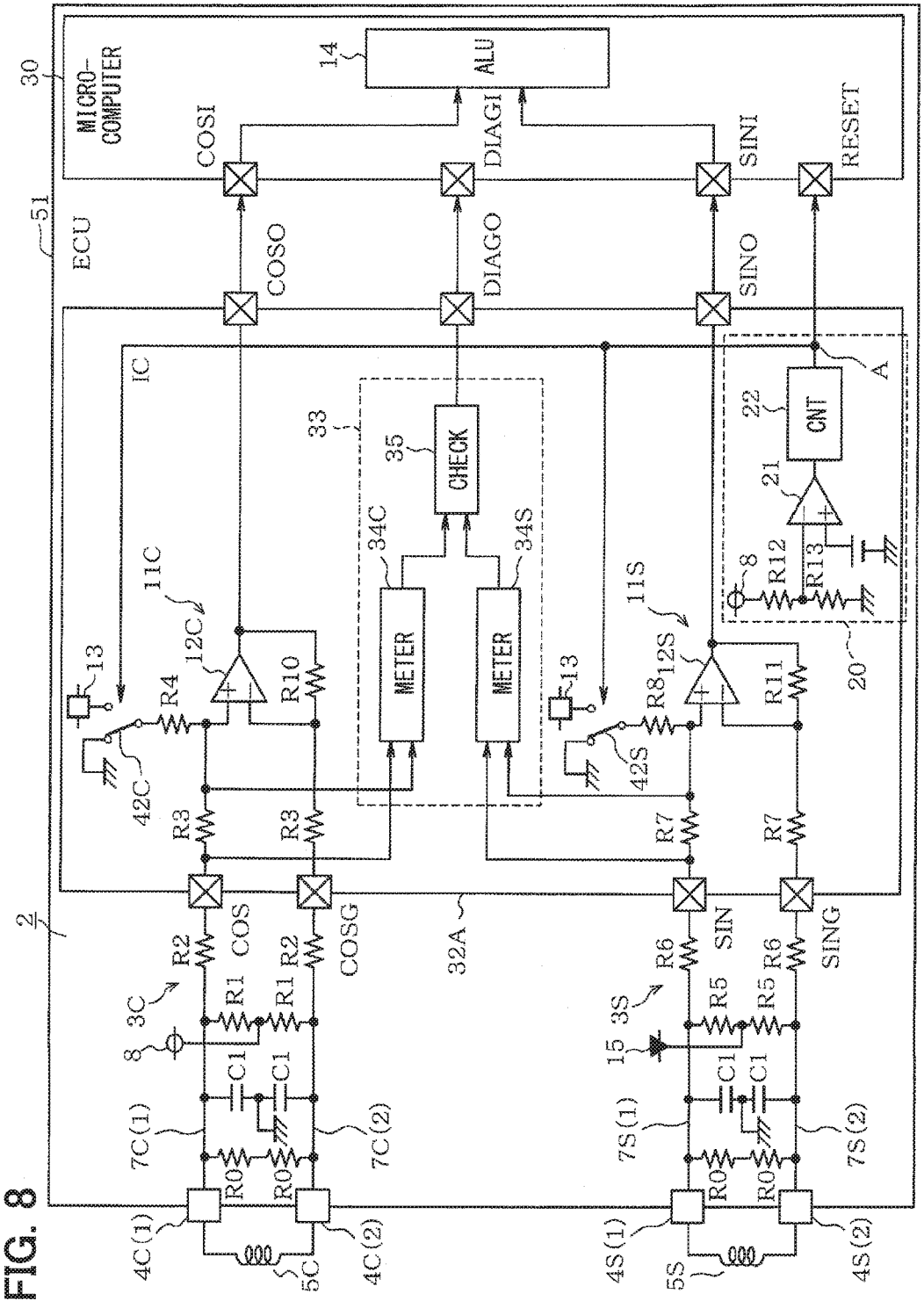
FIG. 8 is a circuit diagram showing a resolver signal detection circuit according to a fifth embodiment.

In a fifth embodiment, as shown in FIG. 8, an ECU 51 is provided with the changeover switches 42C and 42S in the ECU 31 of the third embodiment in the similar manner as in the fourth embodiment. An operation of the ECU 51 corresponds to a combination of the operations of the third embodiment and the fifth embodiment.

The resolver signal detection circuit is not limited to the embodiments described above or shown in the drawings but may be implemented with the following modifications or variations. The output signal of the power supply control part 20 need not use the power-on reset signal of the microcomputer 30 but may be configured as an independent signal output circuit. The second embodiment may be implemented in the third to fourth embodiments. The resolver is not limited to application to the driving motor for travel of the electric vehicle.

What is claimed is:

1. A resolver signal detection circuit comprising:
   first and second offset power supplies for supplying offset voltages to a COS-phase signal and a SIN-phase signal, each of which is inputted from each phase of a resolver through two signal wires including a high-potential side signal wire and a low-potential side signal wire, respectively;
   a series resistor circuit provided in each signal wire and formed of plural resistor elements;
   a first resistor element connected between a supply node of the offset voltage and an input terminal of the series resistor circuit;
   a detection power supply for supplying a reference voltage to detect the COS-phase signal and the SIN-phase signal of the resolver;
   a power supply control part for controlling the first and the second offset power supplies to supply the offset voltages at time of starting an operation and controlling the detection power supply to supply the reference voltage after a predetermined delay time period from supply of the offset voltages;

a second resistor element connected between the supply node of the reference voltage and an output terminal of the series resistor circuit provided in the high-potential side signal wire; and a comparison logic part, input terminals of which are connected to a common connection node of the resistor elements of the series resistor circuit for comparing voltages between the two signal wires, wherein the comparison logic part detects disconnection of the signal wire based on the voltages inputted to the input terminals during the predetermined delay time period.

2. The resolver signal detection circuit according to claim 1, wherein the comparison logic part includes:

a first comparator for comparing a voltage between the high-potential side signal wire and the low-potential side signal wire, to which the COS-phase signal is inputted, with a first threshold voltage corresponding to a maximum value of the COS-phase signal;

a second comparator for comparing a voltage of the high-potential side signal wire, to which the SIN-phase signal is inputted, with a second threshold voltage developed by dividing the offset voltage of the second power supply by resistor elements provided in a path between a terminal, to which the offset voltage is supplied, and a terminal, to which the reference voltage is supplied;

a third comparator for comparing a voltage of the high-potential side signal wire, to which the COS-phase signal is inputted, with a third threshold voltage developed by dividing the offset voltage of the first power supply by resistor elements provided in a path between a terminal, to which the offset voltage is supplied, and a terminal, to which the reference voltage is supplied;

a fourth comparator for comparing a voltage between the high-potential side signal wire and the low-potential side signal wire, to which the SIN-phase signal is inputted, with a fourth threshold voltage corresponding to a maximum value of the SIN-phase signal;

a first AND gate for performing an AND operation on output signals of the first comparator and the second comparator;

a second AND gate for performing an AND operation on output signals of the third comparator and the fourth comparator; and an OR gate for performing an OR operation on output signals of the first AND gate and the second AND gate.

3. The resolver signal detection circuit according to claim 1, wherein:

the power supply control part activates the first offset power supply and the second offset power supply first and then activates the detection power supply after the predetermined delay time period.

4. The resolver signal detection circuit according to claim 3, wherein:

the power supply control part controls the activation of each power supply by using a power-on reset signal.

5. The resolver signal detection circuit according to claim 1, wherein:

the power supply control part includes a voltage supply control part for controlling supply of the reference voltage from the detection power supply; and the power supply control part activates the first offset power supply, the second offset power supply and the detection power supply at same time and then controls the voltage supply control part to supply the reference voltage after the predetermined delay time period.

6. The resolver signal detection circuit according to claim 1, further comprising:

a microcomputer having input terminals, which receive an output signal of the comparison logic part indicating the detection of the signal wire and signals corresponding to the COS-phase signal and the SIN-phase signal of the resolver.

7. The resolver signal detection circuit according to claim 6, wherein:

the microcomputer has a further input terminal, which receives an output signal of the power supply circuit indicating the elapse of the predetermined delay time period.

* * * * *